(12) United States Patent
Lee

(10) Patent No.: US 7,554,857 B2
(45) Date of Patent: Jun. 30, 2009

(54) DATA OUTPUT MULTIPLEXER

(75) Inventor: Sang-Hee Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 29 days.

(21) Appl. No.: 11/528,972

(22) Filed: Sep. 27, 2006

(65) Prior Publication Data

US 2007/0081397 A1    Apr. 12, 2007

(30) Foreign Application Priority Data

Sep. 28, 2005 (KR) .................. 10-2005-0090862
Dec. 27, 2005 (KR) .................. 10-2005-0130864

(51) Int. Cl.
*G11C 7/10* (2006.01)

(52) U.S. Cl. .................. 365/189.02; 365/200; 365/203; 365/230.03; 326/113

(58) Field of Classification Search .................. 327/202, 327/203, 199; 326/95, 98; 365/189.02, 200, 365/203, 222, 230.03
See application file for complete search history.

(56) References Cited

U.S. PATENT DOCUMENTS

| 5,097,154 | A | | 3/1992 | Adams | |
|---|---|---|---|---|---|
| 5,590,086 | A | * | 12/1996 | Park et al. | 365/230.03 |
| 5,631,871 | A | * | 5/1997 | Park et al. | 365/203 |
| 5,703,828 | A | * | 12/1997 | Park et al. | 365/230.03 |
| 5,802,555 | A | | 9/1998 | Shigeeda | |
| 6,310,491 | B1 | * | 10/2001 | Ogawa | 326/46 |
| 6,320,794 | B1 | | 11/2001 | Kang et al. | |
| 6,337,830 | B1 | | 1/2002 | Faue | |
| 6,741,111 | B1 | * | 5/2004 | Wu | 327/199 |
| 6,794,914 | B2 | * | 9/2004 | Sani et al. | 327/202 |
| 6,842,059 | B1 | * | 1/2005 | Wu | 327/199 |
| 6,914,844 | B2 | | 7/2005 | Suh | |
| 7,002,374 | B2 | * | 2/2006 | Anderson et al. | 326/95 |
| 2004/0004499 | A1 | * | 1/2004 | Yonemaru | 326/113 |
| 2004/0155678 | A1 | * | 8/2004 | Anderson et al. | 326/46 |

FOREIGN PATENT DOCUMENTS

| KR | 2002-0075723 | 10/2002 |
|---|---|---|
| KR | 2002-0085758 | 11/2002 |
| KR | 2004-0001270 | 1/2004 |

\* cited by examiner

*Primary Examiner*—Vibol Tan
(74) *Attorney, Agent, or Firm*—Blakely, Sokoloff, Taylor & Zafman

(57) ABSTRACT

A data output multiplexer for multiplexing and transferring data of a data input/output (I/O) line includes a first latch unit coupled to the data I/O line to latch the data of the data I/O line, a transmission gate unit to transfer an output of the first latch unit in response to control signals, a second latch unit to latch an output of the transmission gate unit, and a leakage current blocking unit to block leakage current between an input node and an output node of the transmission gate unit by fixing the input node and the output node at the same logic level values during a power down mode or a self refresh mode.

19 Claims, 3 Drawing Sheets

DATA OUTPUT MULTIPLEXER

FIELD OF THE INVENTION

The present invention relates to a data output multiplexer of a semiconductor memory device for supporting a power down mode, and more particularly, to a data output multiplexer of a semiconductor memory device for reducing power consumption and leakage current.

DESCRIPTION OF RELATED ARTS

Generally, a data input/output (I/O) circuit of a semiconductor memory device supports several data I/O modes, e.g., 3 data I/O modes, using 16 I/O pads (×16), 8 I/O pads (×8), and 4 I/O pads (×4), respectively. Memory manufacturing companies usually design semiconductor memory devices to be able to support all of the above modes ×16, ×8, and ×4, and operate in a certain I/O mode (i.e., ×4, ×8, or ×16) selected by performing a user's option process. For the purpose, memory device generally includes a data output multiplexer. The data output multiplexer transfers data of a global I/O line (GIO) to a pipe line latch according to the I/O mode (i.e., ×4, ×8, or ×16) and address information.

FIG. 1 illustrates a circuit diagram of a typical data output multiplexer. Each of data output multiplexers 1, 2, 3, and 4 receives data outputted from a memory core and loaded in a GIO, and transfers the data to a pipe line latch (not shown) according to I/O options. More specifically, each of the data output multiplexers 1, 2, 3, and 4 receives global I/O signals GIO_Q<0:3> and is controlled by a multiplexer selection signal IO_OPT and a read/write selection signal RD_flagb to generate output signals MXOUT_Q<0:3>. The read/write selection signal RD_flagb has a logic level 'high' when writing data, and a logic level 'low' when reading out data. The multiplexer selection signals IO_OPT are generated by a ×16, ×8, or ×4 mode selection signal and address coding.

In other words, in the ×16 mode, transmission gates in the data output multiplexers 1, 2, 3, and 4 are activated by control signals, wherein the control signals are generated by logically combining the multiplexer selection signals IO_OPT<0:3> and the read/write selection signal RD_flagb, where all bits of the multiplexer selection signals IO_OPT<0:3> become a logic level 'high'. Thus, all of the data output multiplexers 1, 2, 3, and 4 are activated and each of the data output multiplexers 1, 2, 3, and 4 outputs the multiplexer output signals MXOUT_Q<0:3>. In the ×8 mode, two bits of the multiplexer selection signals IO_OPT<0:3> become a logic level 'high' in response to an address coding, and thus, two of the data output multiplexers 1, 2, 3, and 4 are activated, and the other two of the data output multiplexers 1, 2, 3, and 4 are inactivated. Each of the activated data output multiplexers outputs the multiplexer output signals MXOUT_Q<0:3>. In the ×4 mode, only one bit of the multiplexer selection signals IO_OPT<0:3> becomes a logic level 'high' in response to two address codings, and thus, one of the data output multiplexers 1, 2, 3, and 4 becomes activated, and the other three of the data output multiplexers 1, 2, 3, and 4 become inactivated.

Each of the data output multiplexers 1, 2, 3, and 4 includes a first latch unit 10 to receive and latch the global input signals GIO_Q<0:3>, a control signal input unit 20 to receive and logically combine the multiplexer selection signal IO_OPT and the read/write selection signal RD_flagb, thereby outputting the control signals TG_ctl and TG_ctlb, a transmission gate unit 30 to transfer output signals of the first latch unit 10 in response to the control signals TG_ctl and TG_ctlb outputted from the control signal input unit 20, and a second latch unit 40 to latch outputs of the transmission gate unit 30.

The first latch unit 10 receives and latches the global input signals GIO_Q<0:3>. The transmission gate unit 30 is either enabled or disabled in response to the control signals TG_ctl and TG_ctlb outputted from the control signal input unit 20 which logically combines the multiplexer selection signal IO_OPT and the read/write selection signal RD_flagb. That is, the transmission gate unit 30 is either enabled or disabled in response to the multiplexer selection signal IO_OPT depending on the ×16, ×8, or ×4 mode. The signals outputted from the first latch unit 10 are transferred to input terminals of the second latch unit 40 by the enabled transmission gate unit 30. The second latch unit 40 latches the received signals and outputs the multiplexer output signals MXOUT_Q<0:3>.

Meanwhile, if the transmission gate unit 30 is enabled by the control signals TG_ctl and TG_ctlb when the global input signals GIO_Q<0:3> are latched at the first latch unit 10, each input terminal 'a' and each output terminal 'b' of the transmission gate unit 30 have the same logic level values, and the second latch unit 40 latches and outputs the same logic level values as the first latch unit 10. Therefore, when the input terminals 'a' and the output terminals 'b' of the transmission gate unit 30 have the same logic level values, a leakage current path may not be generated when the transmission gate unit 30 is disabled later on.

However, if the transmission gate unit 30 is disabled by the control signals TG_ctl and TG_ctlb and the global input signals GIO_Q<0:3> having logic level values different to the existing logic levels are inputted and latched at the first latch unit 10, the input terminals 'a' and the output terminals 'b' of the transmission gate unit 30 have different logic level values. Thus, the leakage current path may be generated due to the logic level difference between the input terminals 'a' and the output terminals 'b'. Many more leakage current paths may be generated when the first latch unit 10 and the second latch unit 40 in each of the data output multiplexers 1, 2, 3, and 4 latch different logic level values. Since the data output multiplexer is related to access time tAA from address signals, if a transistor having a low threshold voltage is used in the transmission gate unit 30 to improve an operational speed, much more leakage current may occur during IDD2P, IDD3P, and IDD6P.

The leakage current path may be generated due to the potential difference between the input/output nodes (i.e., input and output terminals 'a' and 'b') of the transmission gate unit 30 in the typical data output multiplexer. Therefore, when a semiconductor memory device enters a power down mode or a self refresh mode after write and read operations, the above problem may be more serious.

SUMMARY OF THE INVENTION

It is, therefore, an object of the present invention to provide a data output multiplexer, capable of preventing the generation of leakage current paths by fixing an input terminal and an output terminal of a transmission gate unit at the same logic level values in a power down mode and a self refresh mode.

In accordance with an aspect of the present invention, there is provided a data output multiplexer for multiplexing and transferring data of a data input/output (I/O) line, the data output multiplexer including: a first latch unit coupled to the data I/O line to latch the data of the data I/O line; a transmission gate unit to transfer an output of the first latch unit in response to control signals; a second latch unit to latch an output of the transmission gate unit; and a leakage current blocking unit to block leakage current between an input node and an output node of the transmission gate unit by fixing the input node and the output node at the same logic level values during a power down mode or a self refresh mode.

In accordance with another aspect of the present invention, there is provided a semiconductor device, including: a transmission gate for transmitting a signal in response to a control signal; and a leakage current blocking unit for keeping voltage levels on an input node and an output node of the transmission gate in response to a clock enable signal.

BRIEF DESCRIPTION OF THE DRAWINGS

The above and other objects and features of the present invention will become more apparent with respect to the following descriptions of the exemplary embodiments given in conjunction with the accompanying drawings, in which.

DETAILED DESCRIPTION OF THE INVENTION

A data output multiplexer in accordance with specific embodiments of the present invention will be described in detail with reference to the accompanying drawings.

Figure 1:
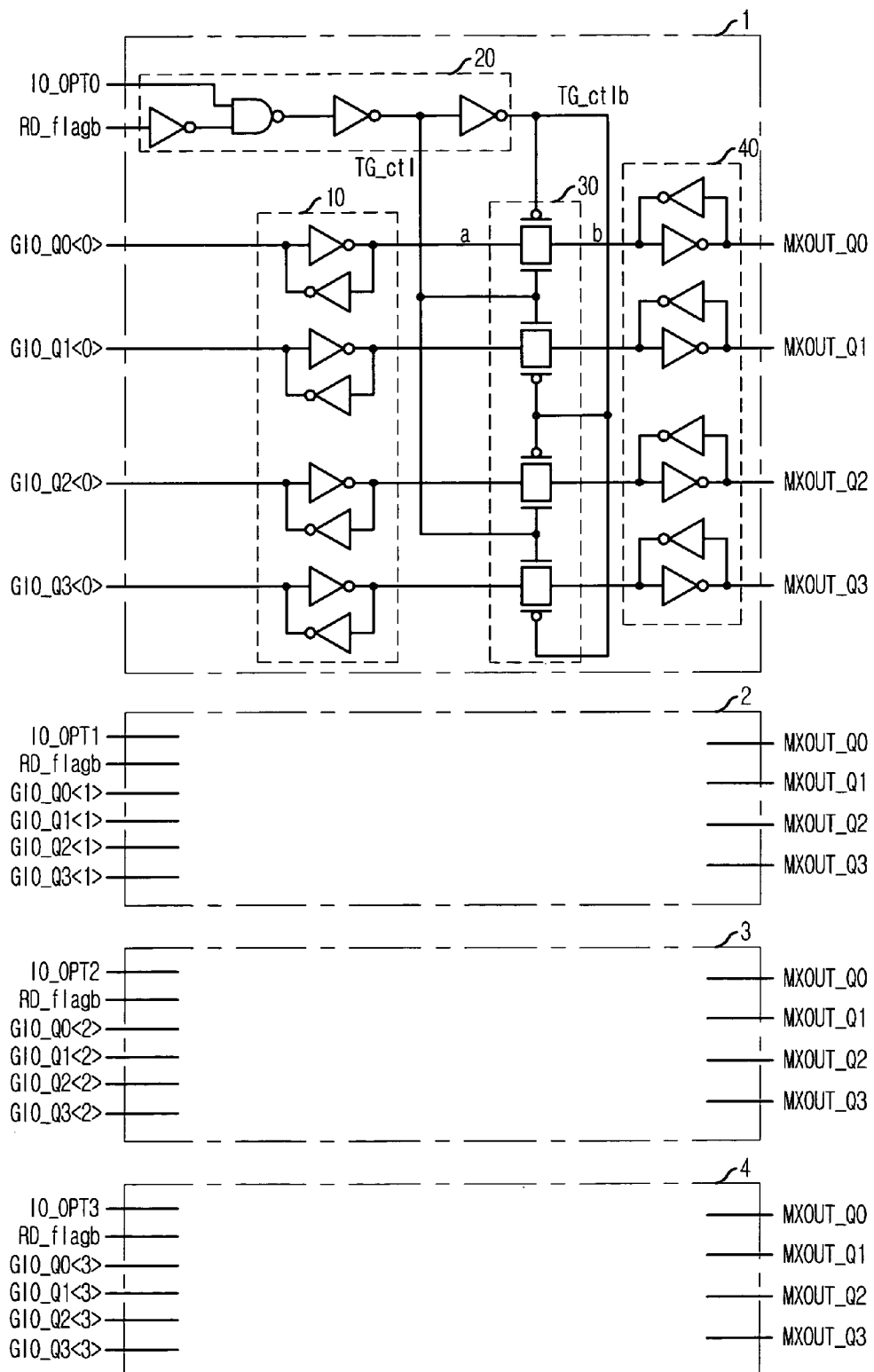
FIG. 1 illustrates a circuit diagram of a typical data output multiplexer.
Figure 2:
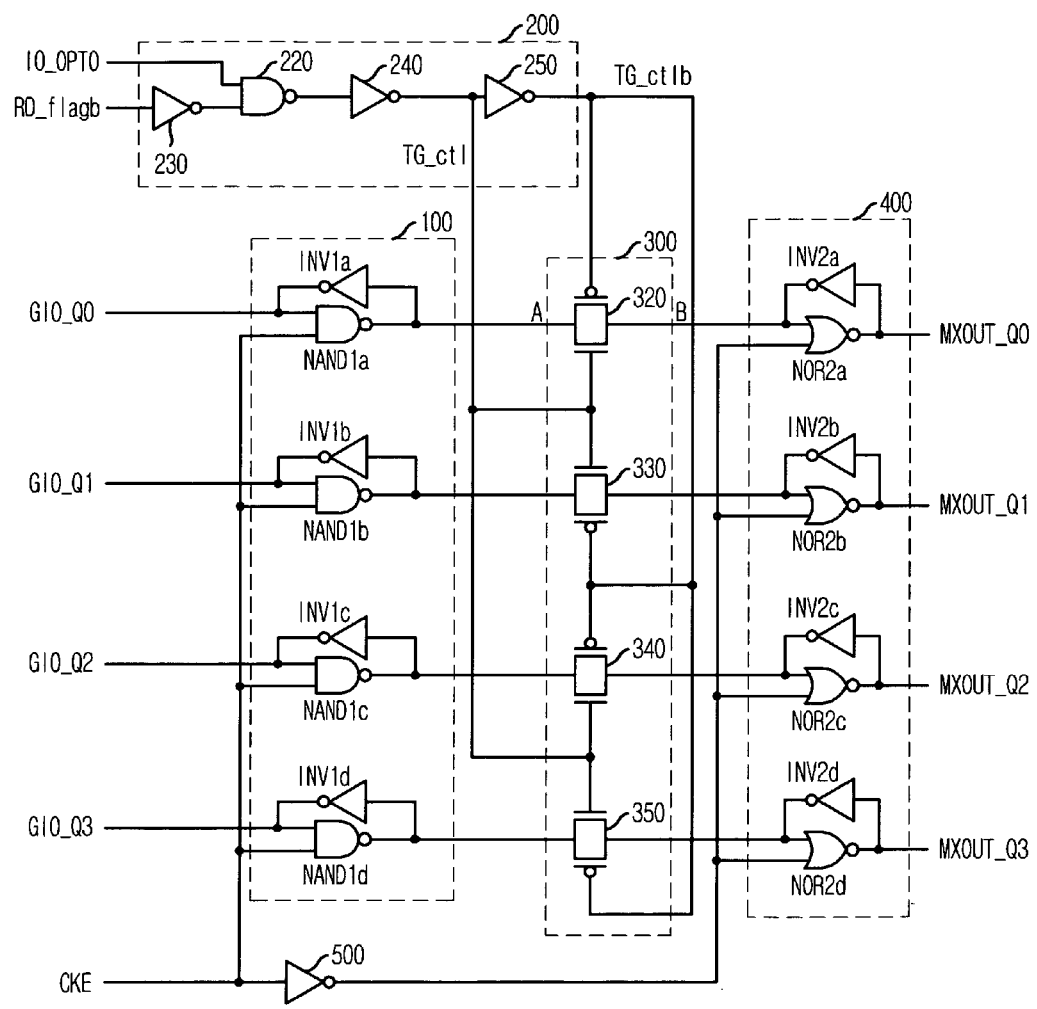
FIG. 2 shows a circuit diagram of a data output multiplexer in accordance with a first embodiment of the present invention.

FIG. 2 illustrates a circuit diagram of a data output multiplexer in accordance with a first embodiment of the present invention.

The data output multiplexer includes a first latch unit 100, coupled to a data I/O line GIO, to latch data of the I/O line GIO GIO_Q<0:3>, a control signal input unit 200 to receive a first control signal IO_OPT0 and a second control signal RD_flagb to thereby generate control signals TG_ctl and TG_ctlb, the transmission gate unit 300 to transfer outputs of the first latch unit 100 to a second latch unit 400 in response to the control signals TG_ctl and TG_ctlb; the second latch unit 400 to latch outputs of the transmission gate unit 300, and a leakage current blocking unit to block leakage current between each input node 'A' and each output node 'B' of the transmission gate unit 300 by fixing the input and output nodes 'A' and 'B' at the same logic level values during a power down mode or a self refresh mode.

The leakage current blocking unit fixes the input nodes 'A' and the output nodes 'B' of the transmission gate unit 300 at a logic level 'high' when a clock enable signal CKE has a logic level 'low', i.e., during the power down mode or self refresh mode.

The leakage current blocking unit includes an inverter 500 to match logic level values of NAND gates NAND1a, NAND1b, NAND1c, and NAND1d of the first latch unit 100 and those of NOR gates NOR2a, NOR2b, NOR2c, and NOR2d of the second latch unit 400, the first and the second latch units 100 and 400 receiving the clock enable signal CKE.

The first latch unit 100 includes the NAND gates NAND1a, NAND1b, NAND1c, and NAND1d and inverters INV1a, INV1b, INV1c, and INV1d. Each of the NAND gates NAND1a, NAND1b, NAND1c, and NAND1d is coupled to a corresponding one of the data I/O line GIO_Q<0:3> by a first input terminal, and receives the clock enable signal CKE through a second input terminal. Input terminals of the inverters INV1a, INV1b, INV1c, and INV1d are coupled to output terminals of the NAND gates NAND1a, NAND1b, NAND1c, and NAND1d, respectively, and output terminals of the inverters INV1a, INV1b, INV1c, and INV1d are coupled to the first input terminals of the NAND gates NAND1a, NAND1b, NAND1c, and NAND1d, respectively. The output terminals of the NAND gates NAND1a, NAND1b, NAND1c, and NAND1d are coupled to the input nodes 'A' of transmission gates 320, 330, 340, and 350 of the transmission gate unit 300, respectively.

The second latch unit 400 includes the NOR gates NOR2a, NOR2b, NOR2c, and NOR2d and inverters INV2a, INV2b, INV2c, and INV2d. Each of the NOR gates NOR2a, NOR2b, NOR2c, and NOR2d is coupled to each output node 'B' of the transmission gates 320, 330, 340, and 350 by a first input terminal, and receives an inverted signal of the clock enable signal CKE through a second input terminal. The inverted clock enable signal is generated by the inverter 500. Input terminals of the inverters INV2a, INV2b, INV2c, and INV2d are coupled to output terminals of the NOR gates NOR2a, NOR2b, NOR2c, and NOR2d, respectively, and output terminals of the inverters INV2a, INV2b, INV2c, and INV2d are coupled to the first input terminals of the NOR gates NOR2a, NOR2b, NOR2c, and NOR2d, respectively.

Each of transmission gates in the transmission gate unit 300 includes an NMOS transistor and a PMOS transistor which receive the control signals TG_ctl and TG_ctlb through their gates, respectively. Also, their source/drain channel is formed between the input node 'A' and the output node 'B'.

The control signals TG_ctl and TG_ctlb are generated by the control signal input unit 200. Thus, the control signal input unit 200 includes a NAND gate 220, a first inverter 230, a second inverter 240, and a third inverter 250. The NAND gate 220 receives the first control signal IO_OPT0 through a first input terminal. The first inverter 230 receives the second control signal RD_flagb, and its output terminal is coupled to a second input terminal of the NAND gate 220. The second inverter 240 is coupled to an output terminal of the NAND gate by its input terminal to output the control signal TG_ctl. The third inverter 250 receives an output of the second inverter 240 to generate the control signal TG_ctlb. The first control signal IO_OPT0 is obtained by logically combining an I/O option signal and an address signal to select the ×16, ×8, or ×4 mode. The second control signal RD_flagb contains read/write information. The second control signal RD_flagb selects a read operation when it has a logic level 'high', and selects a write operation when it has a logic level 'low'.

In more detail, when the clock enable signal CKE has a logic level 'high' and the control signals TG_ctl and TG_ctlb are enabled, the first latch unit 100 latches the data of the data I/O line GIO_Q<0:3> and the transmission gate unit 300 transfers the output signals of the first latch unit 100 to the second latch unit 400. The second latch unit 400 receives and latches the output signals transferred through the transmission gate unit 30 and outputs multiplexer output signals MXOUT_Q<0:3>.

Meantime, leakage current is generated if there exists a potential difference between the input nodes 'A' and the output nodes 'B' of the transmission gate unit 300, i.e., the input nodes 'A' and the output nodes 'B' have different logic level values to each other, when the semiconductor memory device enters the power down mode or the self refresh mode after the write or read operation. However, in accordance with the first embodiment of this invention, when the memory device enters the power down mode or the self refresh mode (in this case, the clock enable signal CKE used in the memory device has a logic level 'low') the input nodes 'A' and the output nodes 'B' are fixed at a logic level 'high' by the clock enable signal CKE, the NAND gates of the first latch unit 100, and the NOR gates of the second latch unit 400. Therefore, although the memory device enters the power down mode or the self refresh mode when the potential difference exists between the input nodes 'A' and the output nodes 'B', the leakage current paths are not generated.

Figure 3:
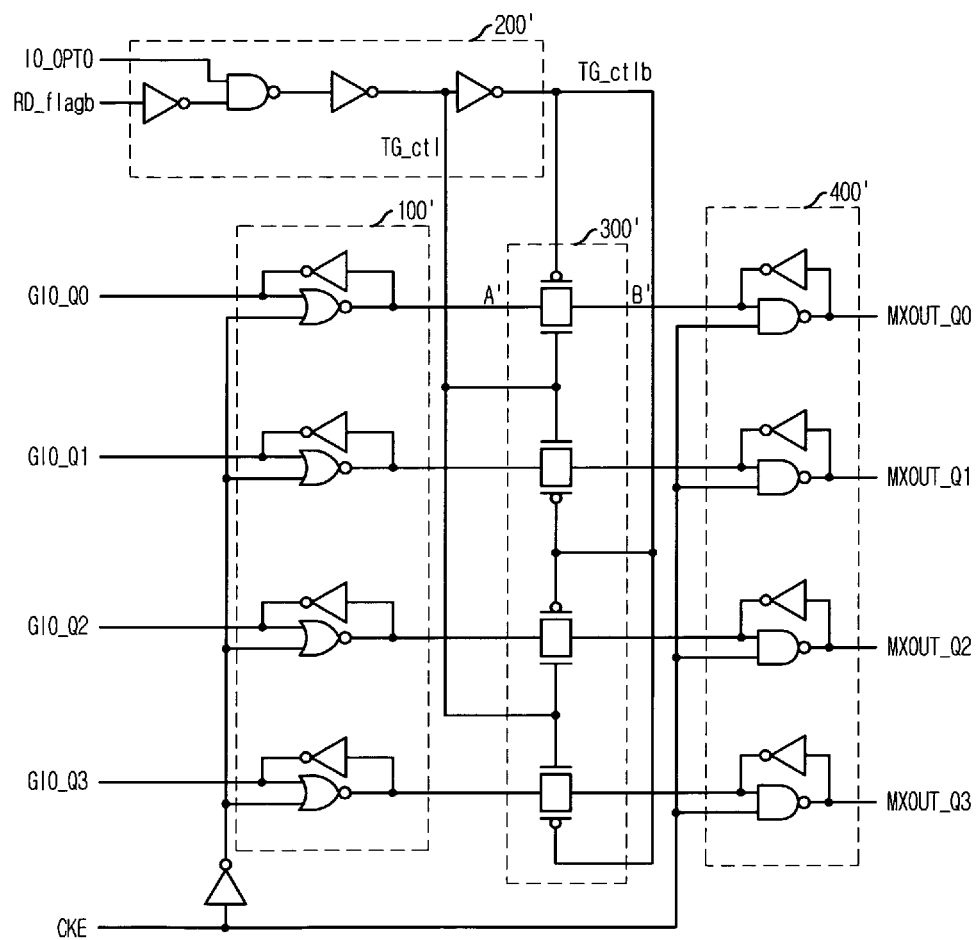
FIG. 3 provides a circuit diagram of a data output multiplexer in accordance with a second embodiment of the present invention.

FIG. 3 illustrates a circuit diagram of a data output multiplexer in accordance with a second embodiment of the present invention.

Input nodes 'A'' and output nodes 'B'' are fixed at a logic level 'low' in the second embodiment. The data output multiplexers in the first embodiment and the second embodiment are similar to each other. However, the second embodiment differs from the first embodiment by comprising a first latch unit 100' using NOR gates which receive an inverted signal of a clock enable signal CKE and a second latch unit 400' using NAND gates which receive the clock enable signal CKE. A control signal input unit 200' and a transmission gate unit 300' are the same as the control signal input unit 200 and the transmission gate unit 300 of the first embodiment of the present invention, respectively.

In the data output multiplexer of the present invention, the transmission gate unit is enabled or disabled in response to the control signals TG_ctl and TG_ctlb outputted from the control signal input unit according to the ×16, ×8, or ×4 mode.

When the transmission gate unit is enabled, the input nodes and the output nodes of the transmission gate unit have the same logic level values (either a logic level 'high' or a logic level 'low'), and thus, the leakage current paths may not be formed.

Furthermore, when the transmission gate unit is disabled during the power down mode or self refresh mode, the first latch unit and the second latch unit latch the same logic level values under the control of the leakage current blocking unit. Thus, the input nodes and the output nodes maintain the same logic level values. Consequently, the leakage current paths may not be formed.

In accordance with the specific embodiments of the present invention, it is possible to prevent the leakage current paths from being generated during the power down mode or the self refresh mode. Consequently, current consumption can be reduced during IDD2P, IDD3P, and IDD6P, resulting in reduced power consumption. Thus, a transmission gate having a low threshold voltage can be used, so that an address access time tAA characteristic can be improved.

The present application contains subject matter related to the Korean patent application Nos. KR 2005-90862 and KR 2005-130864, filed in the Korean Patent Office on Sep. 28, 2005 and Dec. 27, 2005, respectively, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A data output multiplexer for multiplexing and transferring data of a data input/output (I/O) line, the data output multiplexer comprising:
   a first latch unit coupled to the data I/O line to latch the data on the data I/O line;
   a transmission gate unit to transfer an output from the first latch unit in response to control signals;
   a second latch unit to latch an output from the transmission gate unit; and
   a leakage current blocking unit to block leakage current between an input node and an output node of the transmission gate unit by fixing the input node and the output node at the same logic level values regardless of an operation of the transmission gate unit during a power down mode or a self refresh mode.

2. The data output multiplexer of claim 1, wherein the leakage current blocking unit fixes the input node and the output node of the transmission gate unit at the same logic level values during the power down mode or the self refresh mode in response to a clock enable signal.

3. The data output multiplexer of claim 2, wherein the first latch unit includes:
   a NAND gate having a first input terminal coupled to the data I/O line and a second input terminal receiving the clock enable signal; and
   an inverter having an input terminal coupled to an output terminal of the NAND gate and an output terminal coupled to the first input terminal of the NAND gate, the output terminal of the NAND gate coupled to the input node of the transmission gate unit, wherein the input node of the transmission gate unit is fixed at a logic level 'high' during the power down mode or the self refresh mode.

4. The data output multiplexer of claim 3, wherein the second latch unit includes:
   a NOR gate having a first input terminal coupled to the output node of the transmission gate unit and a second input terminal receiving an inverted signal of the clock enable signal; and
   an inverter having an input terminal coupled to an output terminal of the NOR gate and an output terminal coupled to the first input terminal of the NOR gate, wherein the output node of the transmission gate unit is fixed at a logic level 'high' during the power down mode or the self refresh mode.

5. The data output multiplexer of claim 2, wherein the first latch unit includes:
   a NOR gate having a first input terminal coupled to the data I/O line and a second input terminal receiving an inverted signal of the clock enable signal; and
   an inverter having an input terminal coupled to an output terminal of the NOR gate and an output terminal coupled to the first input terminal of the NOR gate, the output terminal of the NOR gate coupled to the input node of the transmission gate unit, wherein the input node of the transmission gate unit is fixed at a logic level 'low' during the power down mode or the self refresh mode.

6. The data output multiplexer of claim 5, wherein the second latch unit includes:
   a NAND gate having a first input terminal coupled to the output node of the transmission gate unit and a second input terminal receiving the clock enable signal; and
   an inverter having an input terminal coupled to an output terminal of the NAND gate and an output terminal coupled to the first input terminal of the NAND gate, wherein the output node of the transmission gate unit is fixed at a logic level 'low' during the power down mode or the self refresh mode.

7. The data output multiplexer of claim 1, wherein the transmission gate unit includes:
   an NMOS transistor having a gate receiving one of the control signals and a source/drain channel formed between the input node and the output node; and
   a PMOS transistor having a gate receiving the other one of the control signals and a source/drain channel formed between the input node and the output node, wherein the control signals have different logic levels from each other.

8. The data output multiplexer of claim 1, further comprising a control signal input unit to generate the control signals based on a first control signal formed by logically combining a data pad option signal and an address signal, and a second control signal having read/write information.

9. The data output multiplexer of claim 8, wherein the control signal input unit includes:
   a NAND gate receiving the first control signal through a first input terminal;
   a first inverter having an output terminal coupled to a second input terminal of the NAND gate and receiving the second control signal;
   a second inverter having an input terminal coupled to an output terminal of the NAND gate; and
   a third inverter to set logic level values of the control signals based on an output of the second inverter.

10. The data output multiplexer of claim 2, wherein the leakage current blocking unit includes an inverter to generate an inverted clock enable signal based on the clock enable signal, the inverted clock enable signal and the clock enable signal being provided to the first latch unit and the second latch unit.

11. A semiconductor device, comprising:
    a transmission gate for transmitting a signal in response to a control signal; and
    a leakage current blocking unit for blocking leakage current between an input node and an output node of the transmission gate by fixing the input node and the output node at the same logic level value regardless of an operation of the transmission gate unit in response to a clock enable signal, wherein the clock enable signal indicates a power down mode and a self refresh mode;
    a first inverse latch coupled to an I/O line for inverting an inputted signal to output the signal to the transmission gate in response to the clock enable signal; and
    a second inverse latch for inverting output of the transmission gate in response to the clock enable signal.

12. The semiconductor device of claim 11, wherein the first inverse latch includes:
    a NAND gate having a first input terminal coupled to the I/O line and a second input terminal receiving the clock enable signal; and
    an inverter having an input terminal coupled to an output terminal of the NAND gate and an output terminal coupled to the first input terminal of the NAND gate, the output terminal of the NAND gate coupled to the input node of the transmission gate unit, wherein the input node of the transmission gate unit is fixed at a logic level 'high' during the power down mode or the self refresh mode.

13. The semiconductor device of claim 12, wherein the second inverse latch includes:
    a NOR gate having a first input terminal coupled to the output node of the transmission gate unit and a second input terminal receiving an inverted signal of the clock enable signal; and
    an inverter having an input terminal coupled to an output terminal of the NOR gate and an output terminal coupled to the first input terminal of the NOR gate, wherein the output node of the transmission gate unit is fixed at a logic level 'high' during the power down mode or the self refresh mode.

14. The semiconductor device of claim 11, wherein the first inverse latch includes:
    a NOR gate having a first input terminal coupled to the data I/O line and a second input terminal receiving an inverted signal of the clock enable signal; and
    an inverter having an input terminal coupled to an output terminal of the NOR gate and an output terminal coupled to the first input terminal of the NOR gate, the output terminal of the NOR gate coupled to the input node of the transmission gate unit, wherein the input node of the transmission gate unit is fixed at a logic level 'low' during the power down mode or the self refresh mode.

15. The semiconductor device of claim 14, wherein the second inverse latch includes:
    a NAND gate having a first input terminal coupled to the output node of the transmission gate unit and a second input terminal receiving the clock enable signal; and
    an inverter having an input terminal coupled to an output terminal of the NAND gate and an output terminal coupled to the first input terminal of the NAND gate, wherein the output node of the transmission gate unit is fixed at a logic level 'low' during the power down mode or the self refresh mode.

16. The semiconductor device of claim 11, wherein the transmission gate includes:
    an NMOS transistor having a gate receiving one of the control signals and a source/drain channel formed between the input node and the output node; and
    a PMOS transistor having a gate receiving the other one of the control signals and a source/drain channel formed between the input node and the output node, wherein the control signals have different logic levels from each other.

17. The semiconductor device of claim 11, further comprising a control signal input unit to generate the control signals based on a first control signal formed by logically combining a data pad option signal and an address signal, and a second control signal having read/write information.

18. The semiconductor device of claim 17, wherein the control signal input unit includes:
    a NAND gate receiving the first control signal through a first input terminal;
    a first inverter having an output terminal coupled to a second input terminal of the NAND gate and receiving the second control signal;
    a second inverter having an input terminal coupled to an output terminal of the NAND gate; and
    a third inverter to set logic level values of the control signals based on an output of the second inverter.

19. The semiconductor device of claim 11, wherein the leakage current blocking unit includes an inverter to generate an inverted clock enable signal based on the clock enable signal, the inverted clock enable signal and the clock enable signal being provided to the first latch unit and the second latch unit.

* * * * *